US010903789B2

(12) United States Patent
Nitzani et al.

(10) Patent No.: US 10,903,789 B2
(45) Date of Patent: Jan. 26, 2021

(54) SYSTEM AND METHOD FOR OPTIMIZING ENERGY GENERATION

(71) Applicant: Nova Lumos Ltd., Netanya (IL)

(72) Inventors: Nir Nitzani, Kefar Sava (IL); Nir Marom, Tzur Moshe (IL); David Vortman, Tzur Moshe (IL); Rafael Boneh, Tel Aviv (IL)

(73) Assignee: Nova Lumos Ltd., Netanya (IL)

( * ) Notice: Subject to any disclaimer, the term of this patent is extended or adjusted under 35 U.S.C. 154(b) by 172 days.

(21) Appl. No.: 15/590,626

(22) Filed: May 9, 2017

(65) Prior Publication Data

US 2017/0324374 A1 Nov. 9, 2017

Related U.S. Application Data

(60) Provisional application No. 62/333,460, filed on May 9, 2016.

(51) Int. Cl.
*H02J 3/38* (2006.01)
*H02S 50/10* (2014.01)
*H02S 40/38* (2014.01)
*H01L 31/042* (2014.01)

(52) U.S. Cl.
CPC ........... *H02S 50/10* (2014.12); *H01L 31/042* (2013.01); *H02J 3/383* (2013.01); *H02S 40/38* (2014.12); *Y02E 10/56* (2013.01)

(58) Field of Classification Search
CPC ..... Y02E 10/563; Y02E 10/58; Y02E 10/763; H02J 3/383; H02J 3/385; H02J 7/35
See application file for complete search history.

(56) References Cited

U.S. PATENT DOCUMENTS

| 7,202,457 | B2 | 4/2007 | Janus et al. | |
|---|---|---|---|---|
| 8,507,837 | B2 * | 8/2013 | Sherman | H02S 50/10 250/203.4 |
| 8,684,190 | B2 | 4/2014 | Abar | |
| 2009/0273481 | A1 * | 11/2009 | Traywick | H01M 10/465 340/636.1 |
| 2010/0108860 | A1 * | 5/2010 | Sherman | G01S 3/781 250/203.4 |

(Continued)

*Primary Examiner* — Alesa Allgood
(74) *Attorney, Agent, or Firm* — The Roy Gross Law Firm, LLC; Roy Gross

(57) ABSTRACT

A system and method for optimizing energy generation. The method includes remotely connecting to an energy storage apparatus that is connected to a tested solar panel; receiving, from the energy storage apparatus, at least one test power measurement, wherein each test power measurement is an amount of power generated by the tested solar panel; obtaining at least one benchmarking power measurement, wherein each benchmarking power measurement is an amount of power generated by one of at least one benchmarking solar panel; determining, based on the at least one benchmarking power measurement, at least one optimization threshold; comparing each test power measurement to each optimization threshold; determining, based on the comparison, whether placement of the tested solar panel is at least an optimal placement; and generating a notification indicating whether placement of the tested solar panel is optimal.

15 Claims, 5 Drawing Sheets

(56) References Cited

U.S. PATENT DOCUMENTS

| | | | |
|---|---|---|---|
| 2011/0109259 A1* | 5/2011 | Choi | H04M 1/0262 |
| | | | 320/101 |
| 2015/0075584 A1* | 3/2015 | Sherman | F24S 50/20 |
| | | | 136/246 |
| 2017/0030950 A1* | 2/2017 | Uebel | H02J 3/383 |

* cited by examiner

SYSTEM AND METHOD FOR OPTIMIZING ENERGY GENERATION

CROSS-REFERENCE TO RELATED APPLICATIONS

This application claims the benefit of U.S. Provisional Application No. 62/333,460 filed on May 9, 2016, the contents of which are hereby incorporated by reference.

TECHNICAL FIELD

The present disclosure relates generally to solar panel installation, and more particularly to optimizing solar panel placement.

BACKGROUND

Approximately 1.5 billion people around the world do not have access to grid electricity. An additional 1 billion are connected to unreliable grids. Many such people live in developing countries where lack of suitable infrastructure prevents access to reliable grids. Even though these people are often poor, they pay far more for lighting than people in many other countries because they use inefficient energy sources (such as kerosene) that are far costlier than grid electricity or environmentally-produced energy. Renewable energy, and in particular energy generated by solar photovoltaic panels, can be particularly suitable for developing countries since transmission and distribution of energy generated from fossil fuels can be difficult and expensive in such countries.

Some existing solutions for providing energy allow users to install solar powered energy storage units, for example in their homes. However, such units typically require professional installation for proper placement of solar panels, which is costly and creates a bottleneck for servicing clients. Solutions that allow for non-professional installation exist, but often face challenges in properly locating solar panels, thereby resulting in suboptimal or inadequate solar power performance. In particular, such solutions face challenges when the installer is a lay person having little to no knowledge of solar panels and optimal capture of solar energy.

For example, some solutions compare power measurements from a solar panel to expected power values made based on theoretical calculations. However, such solutions may be inaccurate, as they fail to account for real constraints such as weather, temporary shade, and the like. Accordingly, such solutions may determine false positives or negatives, thereby resulting in sub-optimal placement.

Many people in developing countries lack access to solar panel installation professionals. Thus, although the case for renewable energy in developing countries is compelling, there remains a problem of how to provide optimal solar panel performance.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a method for optimizing energy generation. The method comprises: remotely connecting to an energy storage apparatus that is connected to a tested solar panel; receiving, from the energy storage apparatus, at least one test power measurement, wherein each test power measurement is an amount of power generated by the tested solar panel; obtaining at least one benchmarking power measurement, wherein each benchmarking power measurement is an amount of power generated by one of at least one benchmarking solar panel; determining, based on the at least one benchmarking power measurement, at least one optimization threshold; comparing each test power measurement to each optimization threshold; determining, based on the comparison, whether placement of the tested solar panel is at least an optimal placement; and generating a notification indicating whether placement of the tested solar panel is optimal.

Certain embodiments disclosed herein also include a non-transitory computer readable medium having stored thereon causing a processing circuitry to execute a process, the process comprising: remotely connecting to an energy storage apparatus that is connected to a tested solar panel; receiving, from the energy storage apparatus, at least one test power measurement, wherein each test power measurement is an amount of power generated by the tested solar panel; obtaining at least one benchmarking power measurement, wherein each benchmarking power measurement is an amount of power generated by one of at least one benchmarking solar panel; determining, based on the at least one benchmarking power measurement, at least one optimization threshold; comparing each test power measurement to each optimization threshold; determining, based on the comparison, whether placement of the tested solar panel is at least an optimal placement; and generating a notification indicating whether placement of the tested solar panel is optimal.

Certain embodiments disclosed herein also include a system for optimizing energy generation. The system comprises: a processing circuitry; and a memory, the memory containing instructions that, when executed by the processing circuitry, configure the system to: remotely connect to an energy storage apparatus that is connected to a tested solar panel; receive, from the energy storage apparatus, at least one test power measurement, wherein each test power measurement is an amount of power generated by the tested solar panel; obtain at least one benchmarking power measurement, wherein each benchmarking power measurement is an amount of power generated by one of at least one benchmarking solar panel; determine, based on the at least one benchmarking power measurement, at least one optimization threshold; compare each test power measurement to each optimization threshold; determine, based on the comparison, whether placement of the tested solar panel is at least an optimal placement; and generate a notification indicating whether placement of the tested solar panel is optimal.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
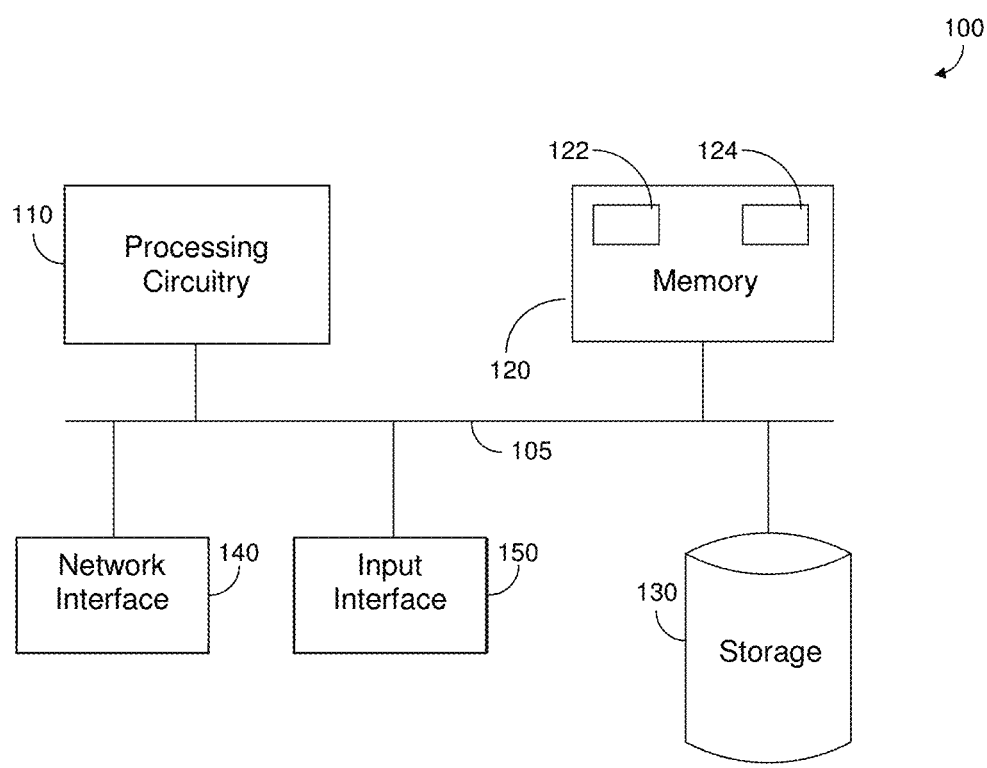
FIG. 1 is a schematic diagram of a placement optimizer according to an embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various disclosed embodiments include a method and system for optimized solar panel installation. The disclosed embodiments may be utilized to optimize placement of solar panels for purposes such as maximizing capture of solar energy, minimizing periods of time in which no or little solar energy is captured, and ensuring cleanliness of the solar panel.

In an embodiment, test power measurements from an energy source to be tested are obtained. The tested energy source may be an energy source such as a solar panel that is to be installed for energy generation. The tested energy source is at least temporarily deployed to allow for capturing of the test power measurements. The test power measurements are compared to an optimization threshold, where the optimization threshold is determined based on benchmarking power measurements from at least one benchmarking energy source. Based on the comparison, it is determined if the placement of the tested energy source is optimal. A notification indicating whether the placement is optimal may be generated and sent. In some embodiments, when it is determined that the placement is sub-optimal, a cause of the sub-optimal placement may be determined.

FIG. 1 shows an example schematic diagram illustrating a placement optimizer 100 according to an embodiment. The placement optimizer 100 includes a processing circuitry 110, a memory 120, a storage 130, a network interface 140, and an input/output (I/O) interface 150. In an embodiment, the components of the placement optimizer 100 may be communicatively connected via a bus 105.

Figure 2:
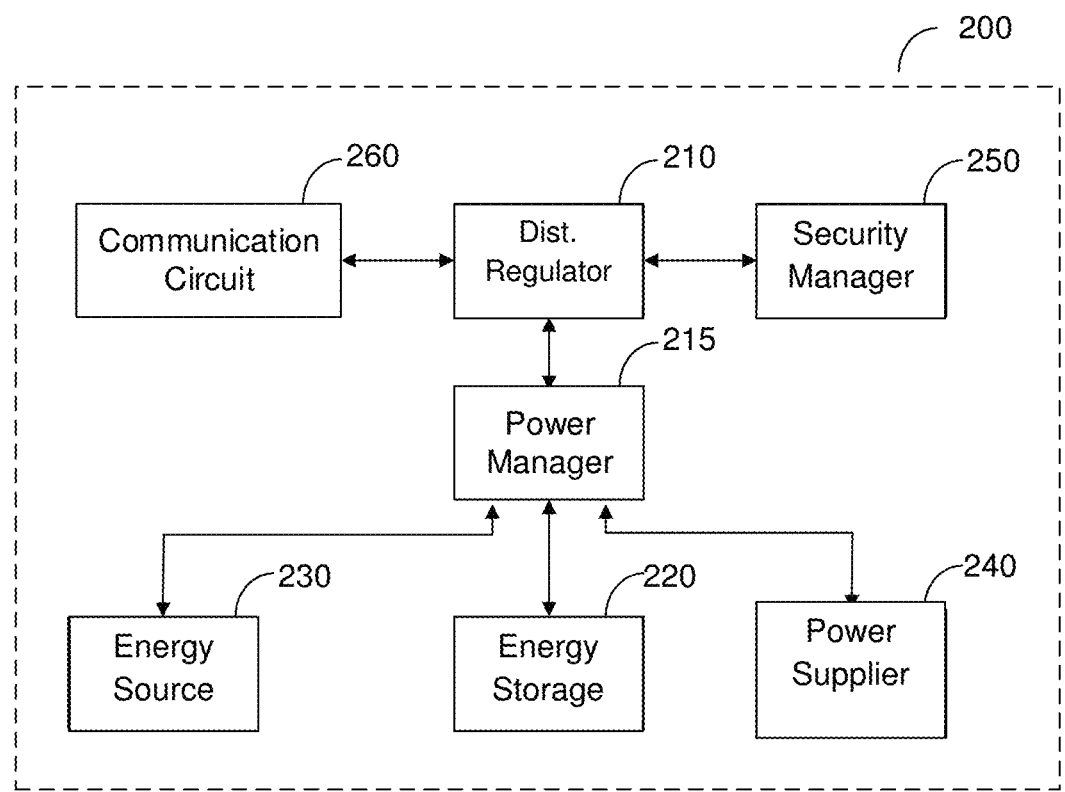
FIG. 2 is a schematic diagram of an energy storage apparatus utilized according to an embodiment.

In an embodiment, the placement optimizer 100 is configured to receive power measurements determined with respect to a plurality of energy sources (e.g., the energy source 230 of the energy storage apparatus 200, FIG. 2). Each received power measurement correlates to an amount of power a respective energy source is capable of generating at its current location.

In an embodiment, based on test power measurements for a tested energy source and benchmarking power measurements for each of at least one benchmarking energy source, the placement optimizer 100 is configured to determine whether the tested energy source is generating an amount of power commensurate with its potential. Specifically, in a further embodiment, the placement optimizer 100 is configured to compare the test power measurements for the tested energy source to an optimization threshold and to determine, based on the comparison, whether the placement of the tested energy source is optimal. In an example implementation, the tested energy source may be an energy source to be installed that is temporarily deployed at a potential installation location and the benchmarking energy sources may be previously installed energy sources.

In an embodiment, the placement optimizer 100 is configured to determine the optimization threshold based on the power measurements of each of the at least one benchmarking energy source. Determining the optimization threshold based on power measurements from benchmarking energy sources allows for determining whether placement is optimal without requiring, e.g., electrical specifications such as the power rating of a particular type of solar panel at predetermined standard conditions. Further, such determination may account for abnormal placement conditions such as, for example, temporary shade, weather, and the like.

In an embodiment, the at least one benchmarking energy source may include only energy sources that are comparable to the tested energy source. Energy sources may be comparable if they are deployed in the same (e.g., within a same threshold distance) or a similar location as the tested energy source. Locations may be similar if the availability of natural resources in the locations allows for energy generation that is approximately the same (e.g., within a similar threshold distance). The same and similar threshold distances may be different. As a non-limiting example, locations may be similar if they are in the same city, within a threshold distance of each other, in the same state, and the like, such that average amounts of sunlight (and, consequently, solar power generation) for the locations is approximately the same. As another non-limiting example, a same location threshold may be 10 feet and a similar location threshold may be 1,000 feet such that energy sources within 10 feet of each other are considered to be at the same location and energy sources within 1,000 feet of each other are considered to be at similar locations.

In an embodiment, the optimization threshold may be determined based on, e.g., an average power measurement among the at least one benchmarking energy source. In a further embodiment, the optimization threshold may be determined based on the average power measurement and a standard deviation of power measurements among the at least one benchmarking energy source. As a non-limiting example, the optimization threshold may be one standard deviation less than the average such that power measurements lower than the optimization threshold indicate as potentially sub-optimal placement.

In another embodiment, the optimization threshold may be determined based on optimal power measurements from an optimally performing energy source among the at least one benchmarking energy source (i.e., the benchmarking energy source with the highest power measurements, highest average power measurements, etc.). To this end, in a further embodiment, the placement optimizer 100 is configured to determine an optimally performing benchmarking energy source based on the benchmarking power measurements from the at least one benchmarking energy source. In another embodiment, the optimization threshold may be below the average power measurement for the optimally performing energy source by a deviation threshold (e.g., a predetermined amount of power or a predetermined proportion of the average power measurement) such that test power measurements below the optimization threshold indicate potentially sub-optimal placement.

In an embodiment, a plurality of test power measurements may be compared to the optimization threshold. Each of the test power measurements may be determined at different times such that the test power measurements represent performance at various points in time. Determining whether performance is optimal based on measurements from different times may allow for, e.g., determining a cause of sub-optimal performance, excluding anomalous readings (e.g., a dip in performance of less than 1 minute), and the like.

In another embodiment, the placement optimizer 100 may be configured to determine more than one optimization threshold, and different test power measurements related to the tested energy source may each be compared to a corresponding optimization threshold. As a non-limiting example, different optimization thresholds may be determined for different time periods (e.g., different hours, morning versus noon versus night, different seasons, etc.), and power measurements related to the tested energy source are compared to corresponding optimization thresholds for the same time period.

Figure 5:
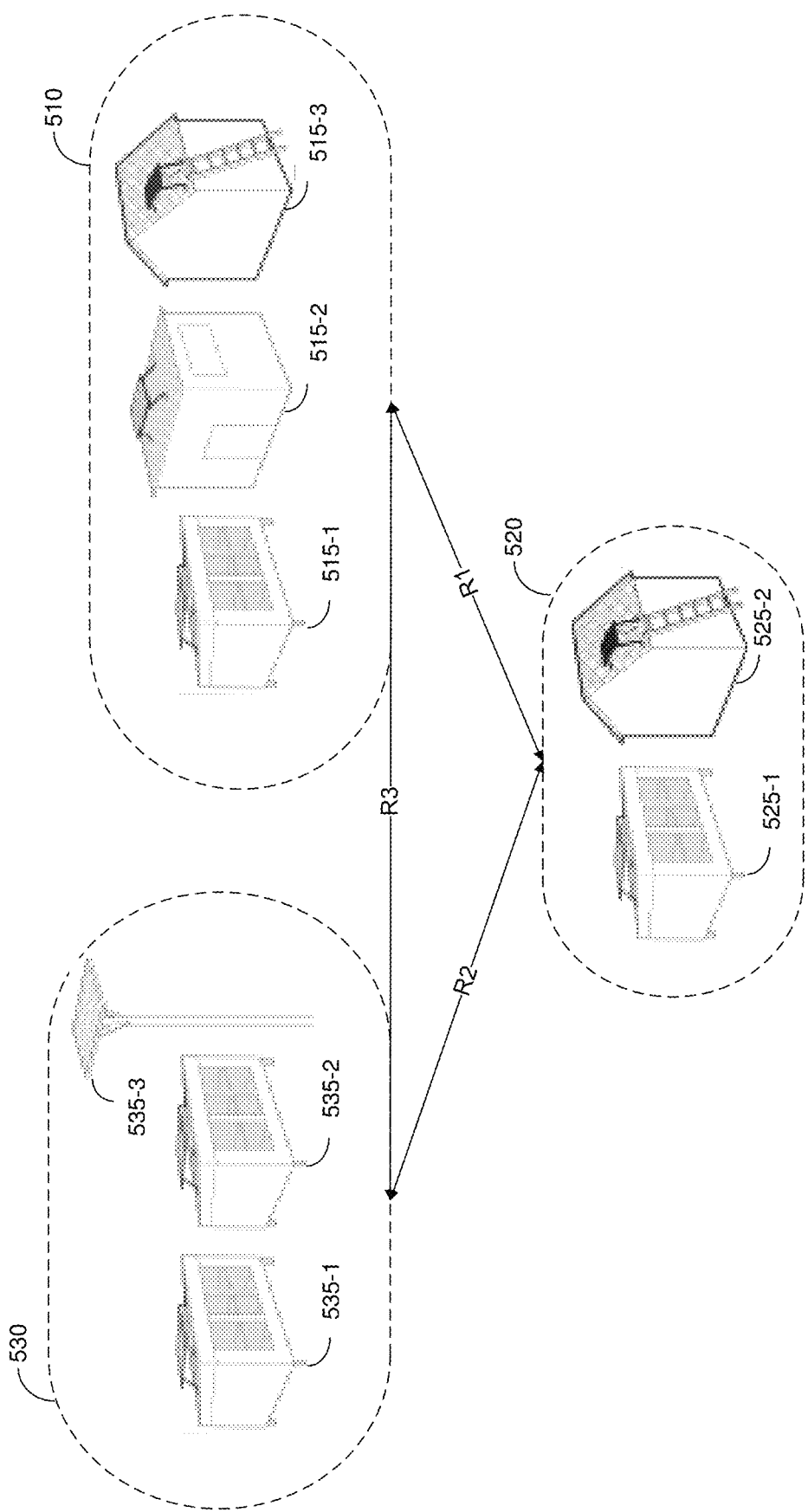
FIG. 5 is a solar panel installation diagram utilized to describe the various disclosed embodiments.

In yet another embodiment, different optimization thresholds may be determined based on benchmarking power measurements from different groups of benchmarking energy sources. As a non-limiting example, a first optimization threshold may be determined based on benchmarking power measurements from benchmarking energy sources at the same location as the tested energy source (e.g., benchmarking energy sources within ten feet of the tested energy source), and a second optimization threshold may be determined based on benchmarking power measurements from benchmarking energy sources at a similar location as the tested energy source (e.g., benchmarking energy sources in the same town as the tested energy source). FIG. 5, described herein below, illustrates an example of different groups of energy sources for which different optimization thresholds may be utilized.

In an embodiment, when it is determined that the placement of the tested energy source is not optimal, the placement optimizer 100 may be configured to determine at least one potential cause of the sub-optimal performance. The at least one cause may be determined based on one or more causation rules, the test power measurements for the tested energy source, each optimization threshold, or a combination thereof. As a non-limiting example, if test power measurements are determined to be optimal during a first threshold period of time and are determined to not be optimal during a subsequent period of time, where the optimal determinations are based on benchmarking energy sources at the same location (e.g., within 10 feet of the tested energy source), it may be determined that the cause of the sub-optimal performance is due to dirt rather than sub-optimal placement. As another non-limiting example, if test power measurements are determined to not be optimal for a brief temporary period of time (e.g., if the test power measurements are optimal, then sub-optimal for less than one hour, then optimal again), it may be determined that the cause of the sub-optimal performance is a temporary obstruction of the tested energy source rather than sub-optimal placement.

The processing circuitry 110 may be realized as one or more hardware logic components and circuits. For example, and without limitation, illustrative types of hardware logic components that can be used include field programmable gate arrays (FPGAs), application-specific integrated circuits (ASICs), Application-specific standard products (ASSPs), system-on-a-chip systems (SOCs), general-purpose microprocessors, microcontrollers, digital signal processors (DSPs), and the like, or any other hardware logic components that can perform calculations or other manipulations of information.

The memory 120 may be volatile (e.g., RAM, etc.), non-volatile (e.g., ROM, flash memory, etc.), or a combination thereof. In one configuration, computer readable instructions to implement one or more embodiments disclosed herein may be stored in the storage 130.

Alternatively or collectively, the memory 120 may be configured to store software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing circuitry to determine if a placement of an energy source is an optimal or otherwise adequate placement.

In an embodiment, the memory 120 may further include a memory portion 122 containing the instructions for causing the processing circuitry 110 to perform the various disclosed embodiments. In another embodiment, the memory 120 may further include a memory portion 124 containing power measurements received from a plurality of energy storage apparatuses with respect to energy sources such as solar panels of each energy storage apparatus.

In an embodiment, the network interface 140 and the input interface 150 allow the placement optimizer 100 to communicate with a network (e.g., the network 310, FIG. 3) for purposes such as, but not limited to, receiving power measurements, sending optimal placement information, and the like.

FIG. 2 is a schematic diagram illustrating an energy storage apparatus 200 utilized according to an embodiment. The energy storage apparatus 200 includes a distribution regulator 210 communicatively connected to a power manager 215, an energy storage 220, an energy source 230, a power supplier 240, a security manager 250, and a communication circuit 260. The components of the energy storage apparatus 200 can be integrated into a single housing, or can be separately housed and interconnected via wires or wirelessly.

The power manager 215 is connected to the energy storage 220, to the energy source 230, and to the power supplier 240. The energy storage 220 stores energy generated by the energy source 230, and the power supplier 240 obtains energy stored in the energy storage 220 from the power manager 215 for delivery to one or more energy withdrawing devices (e.g., the energy withdrawing devices 320, 322, 324, and 326, FIG. 3). The power manager 215 controls charging and discharging of energy to or from the energy storage 220.

The energy source 230 generates renewable energy based on environmental energy sources such as, but not limited to, the sun (i.e., solar energy), water (e.g., hydroelectric or wave generators), wind, and the earth (i.e., geothermal energy). To this end, the energy source 230 may be or may include at least one solar panel, at least one photovoltaic panel, a hydroelectric generator, a wave generator, a wind turbine, and the like.

In some implementations, the energy storage apparatus 200 may be a hybrid device configure to store energy generated by the energy source 230 and from, e.g., an electrical grid (not shown). To this end, the energy storage apparatus 200 may be connected to an electrical grid via, e.g., a voltage converter (not shown), and the power manager 215 may be configured to store energy from the electrical grid in the energy storage 220.

The security manager 250 may be configured to detect unauthorized access events related to the energy storage apparatus 200. Unauthorized access events may include, but are not limited to, attempting to bypass the distribution regulator 210 while accessing the energy withdrawing devices, attempting to access the energy storage 220 directly, attempting to obtain energy from the energy storage apparatus 200 while failing to comply with at least one access rule, and the like. The at least one access rule may include providing sufficient payment to meet a payment requirement, and may be met based on secure tokens received by the security manager 250 indicating that sufficient payment has been made.

The security manager 250 may be configured to cause the distribution regulator 210 to cease distribution of power from the energy storage 220 or to enter a reduced power mode upon detection of an unauthorized access event. In an example implementation, the reduced power mode may be a "trickle" power mode such that, in the trickle power mode, the energy storage apparatus 200 stores only the minimum amount of power required to maintain at least one basic function of the energy storage apparatus 200 (e.g., keeping a battery sufficiently charged to prevent damage thereto). The security manager 250 may further cause the distribution regulator 210 to resume a normal power mode once the unauthorized access event is over. Switching to the reduced power mode may be utilized to prevent the unauthorized access attempt while preventing damage to or failure of at least a portion of the energy storage apparatus 200.

The security manager 250 may include or be communicatively connected to at least one sensor (not shown) such as, but not limited to, motion sensors, trip sensors, accelerometers, and the like, and unauthorized access events may be detected when bypass attempts are made as determined based on sensor signals from the at least one sensor. For example, an unauthorized access event may be detected when a sensor utilized to monitor a connection between the power supplier 240 and the energy storage 220 is tripped (i.e., when movement that may be related to bypassing the power supplier 240 and accessing the energy storage 220 directly is detected).

Figure 3:
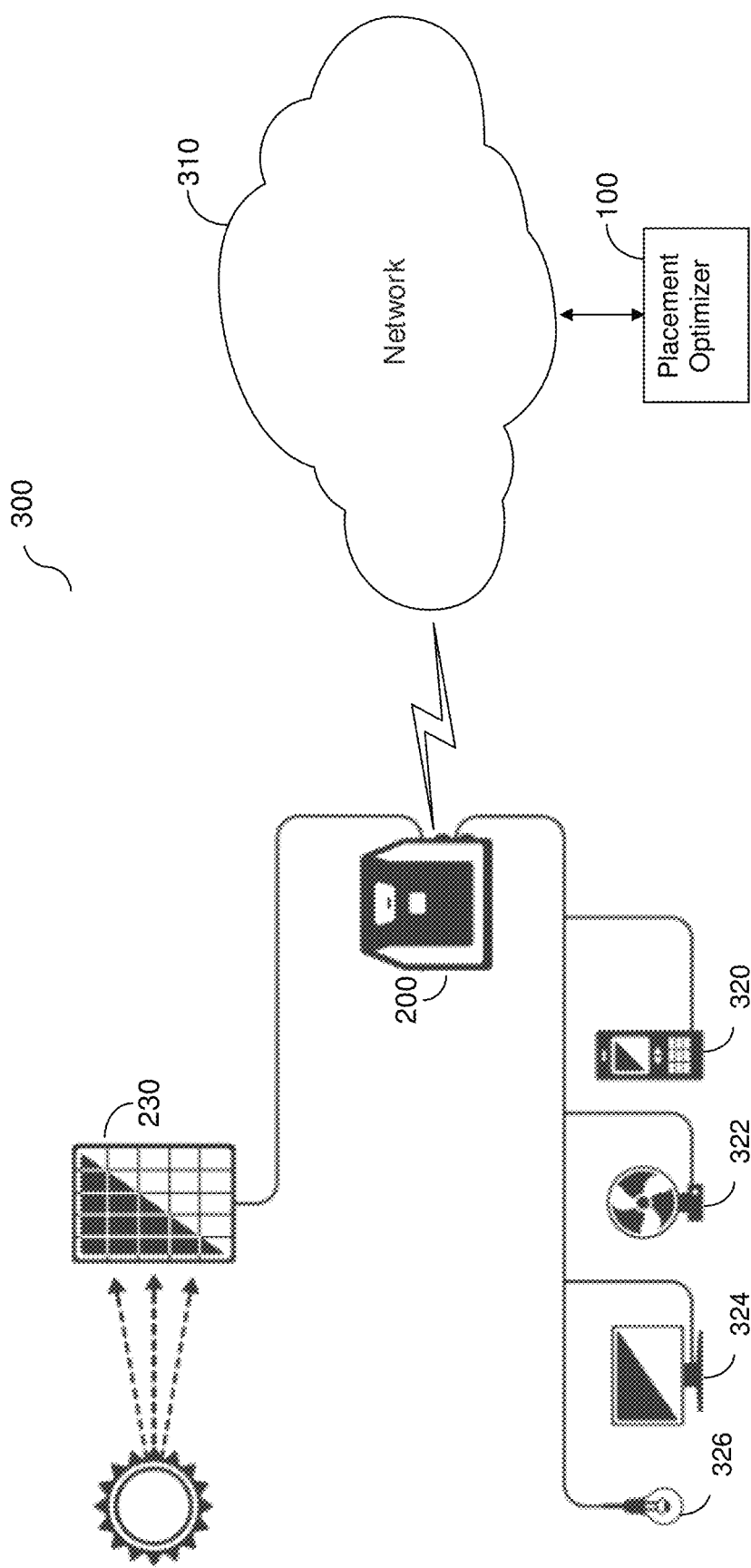
FIG. 3 is a network diagram utilized to describe the various disclosed embodiments.

The communication circuit 260 is configured to enable communications between the energy storage apparatus 200 and, for example, a network (e.g., the network 310, FIG. 3). The communications may be utilized for purposes such as, but not limited to, sending power measurements related to the energy storage apparatus 200 (e.g. measurements of power generated by the energy source 230).

The energy storage apparatus 200 may include a processing circuitry (not shown) coupled to a memory (not shown). In an example implementation, the processing circuitry and memory may be included in the distribution regulator 210.

The processing circuitry may be realized as one or more hardware logic components and circuits. For example, and without limitation, illustrative types of hardware logic components that can be used include field programmable gate arrays (FPGAs), application-specific integrated circuits (ASICs), Application-specific standard products (ASSPs), system-on-a-chip systems (SOCs), general-purpose microprocessors, microcontrollers, digital signal processors (DSPs), and the like, or any other hardware logic components that can perform calculations or other manipulations of information.

The memory may be volatile (e.g., RAM, etc.), non-volatile (e.g., ROM, flash memory, etc.), or a combination thereof. Alternatively or collectively, the memory may be configured to store software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing circuitry to regulate energy charging and discharging and switching between normal and reduced power modes. The instructions may further configure the processing circuitry to determine power measurements based on energy generated by the energy source 230, energy stored in the energy storage 220 from the energy source 230, and the like.

FIG. 3 is a network diagram 300 utilized to describe the various disclosed embodiments. The network diagram 300 includes a network 310 communicatively connected to the placement optimizer 100 and the energy storage apparatus 200. The energy storage apparatus 200 is connected to the energy source 230 that is to be tested and to a plurality of energy consuming devices 320, 322, 324, and 326. In the non-limiting example implementation shown in FIG. 3, the tested energy source 230 is a solar panel and the energy consuming devices include a mobile device 320, a fan 322, a screen 324, and a light fixture 326. In an embodiment, the placement optimizer 100 is remote (i.e., not at the same location as) the tested energy source 230 and the energy storage apparatus 200.

The network 310 may be, but is not limited to, a wireless, cellular or wired network, a local area network (LAN), a wide area network (WAN), a metro area network (MAN), the Internet, the worldwide web (WWW), similar networks, and any combination thereof.

The energy storage apparatus 200 stores energy generated by the energy source 230 and distributes power among the energy consuming devices 320, 322, 324, and 326. The energy storage apparatus 200 may be configured to determine test power measurements representing an amount of power generated by the tested energy source 230 at the current location of deployment. To this end, each of the power measurements may indicate, e.g., the amount of energy stored in the energy storage apparatus 200 from the test energy source 230. In an embodiment, the placement optimizer 100 is configured to receive the test power measurements determined by the energy storage apparatus 200.

In an embodiment, the placement optimizer 100 is configured to determine an optimization threshold based on benchmarking power measurements for a plurality of benchmarking energy sources (not shown in FIG. 3) and to compare test power measurements for the tested energy source 230 to the optimization threshold to determine whether placement of the tested energy source 230 is optimal. In a further embodiment, when it is determined that placement of the tested energy source 230 is not optimal, a notification indicating the sub-optimal placement may be generated and sent to, e.g., a user device or a server (not shown). In yet a further embodiment, a cause of a sub-optimal placement may be determined as described herein above.

It should be noted that a single energy source 230 and four energy consuming devices 320, 322, 324, and 326 are shown in FIG. 3 merely for example purposes and without limitation on the disclosed embodiments. Additional energy sources and more, fewer, or different energy consuming devices may be connected to the energy storage apparatus 200 without departing from the scope of the disclosure. For example, three solar panels may be connected to the energy storage apparatus 200. As another example, a television and no other energy consuming devices may be connected to the energy storage apparatus 200.

Figure 4:
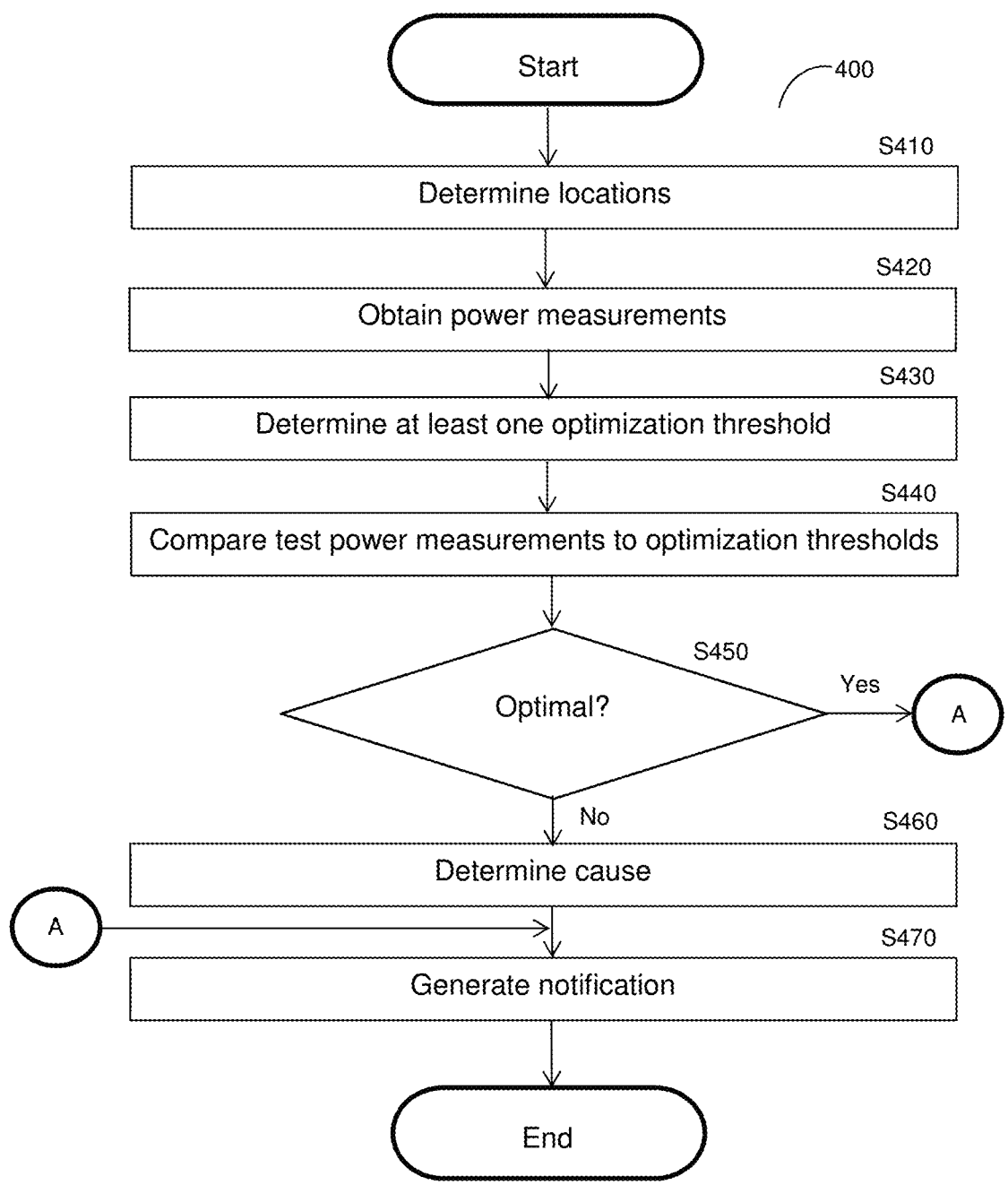
FIG. 4 is a flowchart illustrating a method for optimizing energy generation according to an embodiment.

FIG. 4 is a flowchart 400 illustrating a method for optimizing energy generation by a tested energy source according to an embodiment. In an embodiment, the method may be performed by the placement optimizer 100. In a further embodiment, the method may be performed based on test and benchmarking power measurements received by the placement optimizer 100 from an energy storage apparatus connected to the tested energy source and from energy storage apparati connected to at least one benchmarking energy source. In yet a further embodiment, the placement optimizer 100 is located remotely (e.g., at least a threshold distance away) from the tested energy source, the benchmarking energy sources, or both.

At optional S410, locations of the tested energy source and a plurality of potential benchmarking energy source are obtained and compared to determine at least one benchmarking energy source to be utilized. In an embodiment, a potential benchmarking energy source is to be utilized as a benchmarking energy source if its location is within a similar distance threshold of the location of the tested energy source.

In an embodiment, S410 may further include determining, based on the comparisons, whether each determined benchmarking energy source is at the same or a similar location. In a further embodiment, a determined benchmarking energy source is at the same location if its location is within a same distance threshold of the tested energy source; otherwise, the benchmarking energy source is at a similar location.

At S420, a plurality of power measurements are obtained. The plurality of power measurements includes at least one test power measurement for the tested energy source and at least one benchmarking power measurement for each benchmarking energy source. The benchmarking energy sources may be energy sources at the same or similar location to the tested energy source. In some embodiments, the benchmarking energy sources may include the tested energy source, where the benchmarking power measurements include previously determined power measurements for the tested energy source, thereby allowing for comparison to previous performance (i.e., if power measurements for the tested energy source are lower than previous power measurements for the tested energy source, placement may be sub-optimal due to, e.g., change in surroundings).

At S430, at least one optimization threshold is determined based on the obtained benchmarking power measurements. In an embodiment, the at least one optimization threshold may be determined with respect to a highest benchmarking power measurement, an average benchmarking power measurement, and the like. In a further embodiment, each optimization threshold may be equal to the difference between the highest or average benchmarking power measurement and a deviation threshold, where the deviation threshold may be, e.g., a predetermined power value or proportion (e.g., 3% of the highest or average power measurement).

In an embodiment, different optimization values may be determined for different benchmarking energy sources or groups of benchmarking energy sources. For example, different optimization thresholds may be determined for groups of benchmarking energy sources at the same location as the tested energy source than for groups of benchmarking energy sources at similar (but not necessarily the same) locations as described further herein above.

At S440, the at least one test power measurement is compared to the at least one optimization threshold to determine whether placement is optimal. In an embodiment, placement is optimal if each test power measurement is above the optimization threshold and potentially sub-optimal if one or more of the test power measurements is below one or more of the optimization thresholds.

At S450, it is checked whether the placement of the tested energy source is optimal and, if so, execution continues with S470; otherwise, execution continues with S460.

At optional S460, when it is determined that placement of the tested energy source is potentially sub-optimal, a cause of the potentially sub-optimal performance may be determined. The cause may be determined based on at least one causation rule, the at least one test power measurement, and the at least one optimization threshold. The at least one causation rule may be based on, but not limited to, whether the sub-optimal power measurements were temporary (i.e., whether optimal power measurements have since resumed), whether sub-optimal power measurements are recurring (e.g., whether sub-optimal performance occurs repeatedly over multiple days, weeks, etc.), time durations of sub-optimal power measurements, times of day in which sub-optimal performance occur, combinations thereof, and the like. Certain causes may be indicative that performance is not sub-optimal despite one or more sub-optimal power measurements. As a non-limiting example, if some test power measurements obtained during a previous week were sub-optimal, and the sub-optimal power measurements were determined only between 3 and 4 PM, it may be determined that the sub-optimal power measurements are not actually indicative of sub-optimal performance.

At S470, a notification may be generated and sent. The notification may indicate whether placement is optimal or sub-optimal, and may further indicate the determined causes of sub-optimal power measurements. The notification may be sent to, e.g., a user device, a storage accessible to the user device, a server, and the like, for subsequent viewing.

In an embodiment, the notification may further include at least one recommendation for optimizing power measurements of the solar panel. To this end, S470 may further include determining the at least one recommendation based on the determined cause. The recommendation may include, but is not limited to, cleaning the energy source, repositioning the energy source, and the like.

FIG. 5 is a solar panel installation diagram 500 utilized to describe the various disclosed embodiments. In the diagram 500, a first plurality of energy storage apparati 515-1 through 515-3 are deployed at a first location 510, a second plurality of energy storage apparati 525-1 and 525-2 are deployed at a second location 520, and a third plurality of energy storage apparati 535-1 through 535-3 are deployed at a third location 530.

In the example diagram 500, the first location 510 and the second location 520 are located at a distance R1 apart, the second location 520 and the third location are located at a distance R2 apart, and the first location 510 and the third location 530 are located at a distance R3 apart. Each of the distances R1, R2, and R3 may be, but is not limited to, a distance between center points (not shown) of the respective energy storage apparati of the corresponding locations, a distance between perimeter points of perimeters of the areas including the respective energy storage apparati of the corresponding locations (i.e., as shown in FIG. 5), and the like. In an example implementation, each of the distances R1, R2, and R3 may be compared to a similar distance threshold to determine whether each of the locations 510, 520, and 530, are similar to each other location. Benchmarking power measurements from benchmarking energy sources at similar locations may be compared to test power measurements from tested energy sources to determine if energy generation of a tested energy source is optimal.

As a non-limiting example, the distances R1 and R2 are below a similar distance threshold while R3 is above the similar distance threshold. Accordingly, power measurements from any of the energy sources 515 at location 510 may be compared to power measurements from any of the energy sources 525 at location 520, and power measurements from any of the energy sources 525 at location 520 may be compared to power measurements from any of the energy sources 535 at location 530. However, power measurements from any of the energy sources 515 at location 510 may not be compared to power measurements from any of the energy sources 535 at location 530. Further, different optimization thresholds may be utilized when comparing a tested energy source to benchmarking energy sources at the same location than when comparing a tested energy source to benchmarking energy sources at a similar location.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

What is claimed is:

1. A method for optimizing energy generation, comprising:
   remotely connecting to a tested energy storage apparatus comprising a solar panel coupled to an energy storage, wherein said tested energy storage apparatus is located at a first installation location;
   receiving, from the tested energy storage apparatus, at least one test power measurement, wherein each test power measurement is an amount of power generated by said solar panel;
   obtaining at least one benchmarking power measurement from at least one benchmarking energy storage apparatus comprising a solar panel coupled to an energy storage, wherein each of said benchmarking energy apparatus is located at one of a plurality of second installation locations, and wherein each of said second installation locations has an energy generation potential that is at least similar to said first installation location;
   determining, based on the at least one benchmarking power measurement, at least one optimization threshold;
   comparing each of said test power measurements to each optimization threshold;
   determining, based on the comparison, whether said first installation location is an optimal placement of said energy storage apparatus; and
   generating a notification based on said determining.

2. The method of claim 1, wherein said similarity in said energy generation potential is determined based on at least one of: a distance between said first installation location and each of said second installation locations; average amounts of sunlight received by said first installation location and each of said second installation locations; and availability of natural resources in said first installation location and each of said second installation locations.

3. The method of claim 1, wherein the at least one benchmarking power measurement includes a plurality of benchmarking power measurements obtained during a plurality of time periods, and wherein said determining of said least one optimization threshold includes determining an optimization threshold for each of said periods of time.

4. The method of claim 1, wherein the at least one optimization threshold is based on at least one of: an average of said benchmarking power measurements, and a maximum of said benchmarking power measurements.

5. The method of claim 1, wherein the energy storage apparatus further includes a controller; and a wireless communication circuit.

6. The method of claim 1, further comprising:
   determining, based on the comparison, that said first installation location is not an optimal placement, when at least one of said test measurements is lower than said optimization threshold; and determining a cause of said determining.

7. The method of claim 6, wherein said determining of said cause is based on at least one of: a duration of a period in which at least one of said test measurements is lower than said optimization threshold, a time of day in which at least one of said test measurements is lower than said optimization threshold, a subsequent period of time in which at least one of said test measurements is lower than said optimization threshold compared to a first period of time.

8. A non-transitory computer readable medium having stored thereon instructions for causing a processing circuitry to execute a process, the process comprising:

remotely connecting to a tested energy storage apparatus comprising a solar panel coupled to an energy storage, wherein said energy storage apparatus is located at a first installation location;

receiving, from the tested energy storage apparatus, at least one test power measurement, wherein each test power measurement is an amount of power generated by said solar panel;

obtaining at least one benchmarking power measurement from at least one benchmarking energy source apparatus comprising a solar panel coupled to an energy storage, wherein each of said benchmarking energy storage apparatus is located at one of a plurality of second installation locations, and wherein each of said second installation locations has an energy generation potential that is at least similar to said first installation location;

determining, based on the at least one benchmarking power measurement, at least one optimization threshold;

comparing each of said test power measurements to each optimization threshold;

determining, based on the comparison, whether said first installation location is an optimal placement of said energy storage apparatus; and generating a notification based on said determining.

9. A system for optimizing energy generation, comprising:

a processing circuitry; and a memory, the memory containing instructions that, when executed by the processing circuitry, configure the system to:

remotely connect to a tested energy storage apparatus comprising a tested solar panel that coupled to an energy storage located at a first installation location, receive, from the tested energy storage apparatus, at least one test power measurement, wherein each test power measurement is an amount of power generated by said solar panel, obtain at least one benchmarking power measurement from at least one benchmarking energy storage apparatus comprising a solar panel coupled to an energy storage, wherein each of said benchmarking energy storage apparatus is located at one of a plurality of second installation locations, and wherein each of said second installation locations has an energy generation potential that is at least similar to said first installation location, determine, based on the at least one benchmarking power measurement, at least one optimization threshold, compare each of said test power measurements to each optimization threshold, determine, based on the comparison, whether said first installation location is an optimal placement of said energy storage apparatus, and generate a notification based on said determining.

10. The system of claim 9, wherein said similarity in said energy generation potential is determined based on at least one of: a distance between said first installation location and each of said second installation locations; average amounts of sunlight received by said first installation location and each of said second installation locations; and availability of natural resources in said first installation location and each of said second installation locations.

11. The system of claim 9, wherein the at least one benchmarking power measurement includes a plurality of benchmarking power measurements obtained during a plurality of time periods, and wherein said determining of said at least one optimization threshold includes determining an optimization threshold for each of said periods of time.

12. The system of claim 9, wherein the at least one optimization threshold is based on at least one of: an average of said benchmarking power measurements, and a maximum of said benchmarking power measurements.

13. The system of claim 9, wherein the energy storage apparatus further includes a controller; and a wireless communication circuit.

14. The system of claim 9, wherein the system is further configured to:

determine, based on the comparison, that said first installation location is not an optimal placement, when at least one of said test measurements is lower than said optimization threshold; and determine a cause of said determining.

15. The system of claim 14, wherein said determining of said cause is based on at least one of: a duration of a period in which at least one of said test measurements is lower than said optimization threshold, a time of day in which at least one of said test measurements is lower than said optimization threshold, a subsequent period of time in which at least one of said test measurements is lower than said optimization threshold compared to a first period of time.

* * * * *